United States Patent
Tanaka

(10) Patent No.: US 7,915,976 B2
(45) Date of Patent: Mar. 29, 2011

(54) SURFACE ACOUSTIC WAVE RESONATOR AND LADDER-TYPE FILTER

(75) Inventor: Nobuhira Tanaka, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/749,626

(22) Filed: Mar. 30, 2010

(65) Prior Publication Data

US 2010/0176900 A1    Jul. 15, 2010

Related U.S. Application Data

(63) Continuation of application No. PCT/JP2008/063882, filed on Aug. 1, 2008.

(30) Foreign Application Priority Data

Oct. 18, 2007   (JP) .................................. 2007-271606

(51) Int. Cl.
   *H03H 9/25*    (2006.01)
   *H03H 9/64*    (2006.01)
   *H03H 9/145*   (2006.01)
(52) U.S. Cl. ..................... 333/195; 333/196; 310/313 C; 310/313 D
(58) Field of Classification Search .................. 333/195, 333/196; 310/313 C, 313 D
   See application file for complete search history.

(56) References Cited

U.S. PATENT DOCUMENTS

| 4,205,285 | A | * | 5/1980 | Dempsey et al. | 333/194 |
| 4,472,694 | A | * | 9/1984 | Lee | 333/194 |
| 6,025,763 | A | * | 2/2000 | Morimoto | 333/195 |
| 6,346,761 | B1 |  | 2/2002 | Isobe et al. |  |
| 2001/0011932 | A1 |  | 8/2001 | Takamiya et al. |  |
| 2002/0044497 | A1 |  | 4/2002 | Kachi et al. |  |
| 2005/0110367 | A1 | * | 5/2005 | Kondratiev | 310/313 B |
| 2010/0237963 | A1 | * | 9/2010 | Takamine | 333/133 |

FOREIGN PATENT DOCUMENTS

| JP | 2000-286663 A | 10/2000 |
| JP | 2001-298348 A | 10/2001 |
| JP | 2002-084162 A | 3/2002 |

OTHER PUBLICATIONS

Official Communication issued in International Patent Application No. PCT/JP2008/063882, mailed on Oct. 7, 2008.

* cited by examiner

*Primary Examiner* — Barbara Summons
(74) *Attorney, Agent, or Firm* — Keating & Bennett, LLP

(57) ABSTRACT

A surface acoustic wave resonator is constructed such that cross widths of an IDT electrode are weighted so that the cross widths are reduced as they move outward in the surface acoustic wave propagation direction, an inner edge of a first bus bar includes inclined portions that are inclined so that the inner edge is spaced a predetermined distance away from an envelope portion adjacent to the first bus bar, an inner edge of a second bus bar includes inclined portions that are inclined so that the inner edge is spaced a predetermined distance away from an envelope portion adjacent to the second bus bar, and the sum N of the numbers of electrode fingers and dummy electrodes that are crossed by a straight line extending from the tip of at least one of the electrode fingers in the surface acoustic wave propagation direction is at least N.

5 Claims, 12 Drawing Sheets

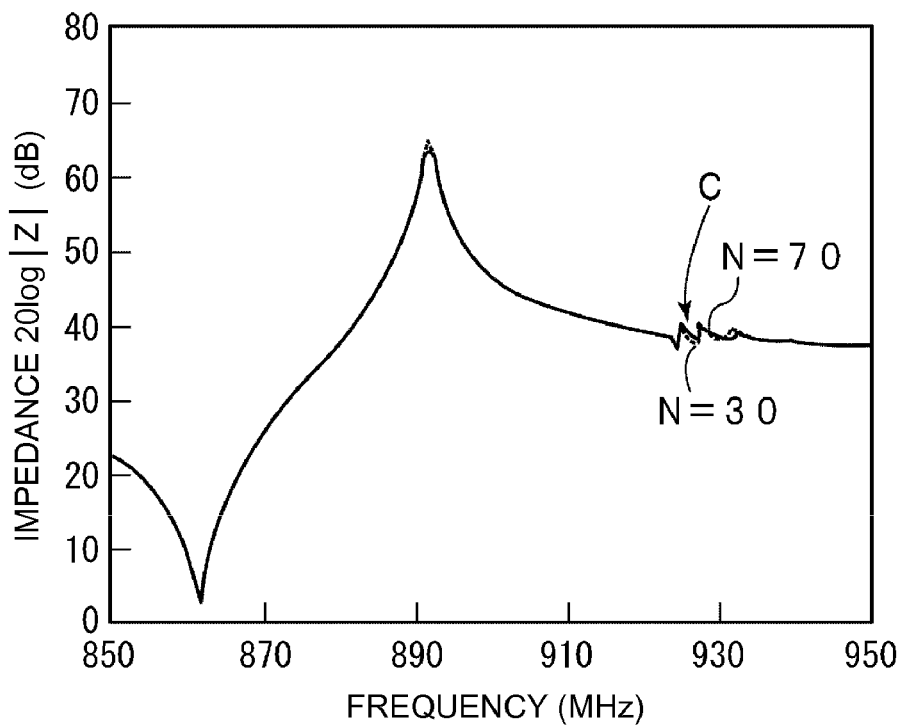
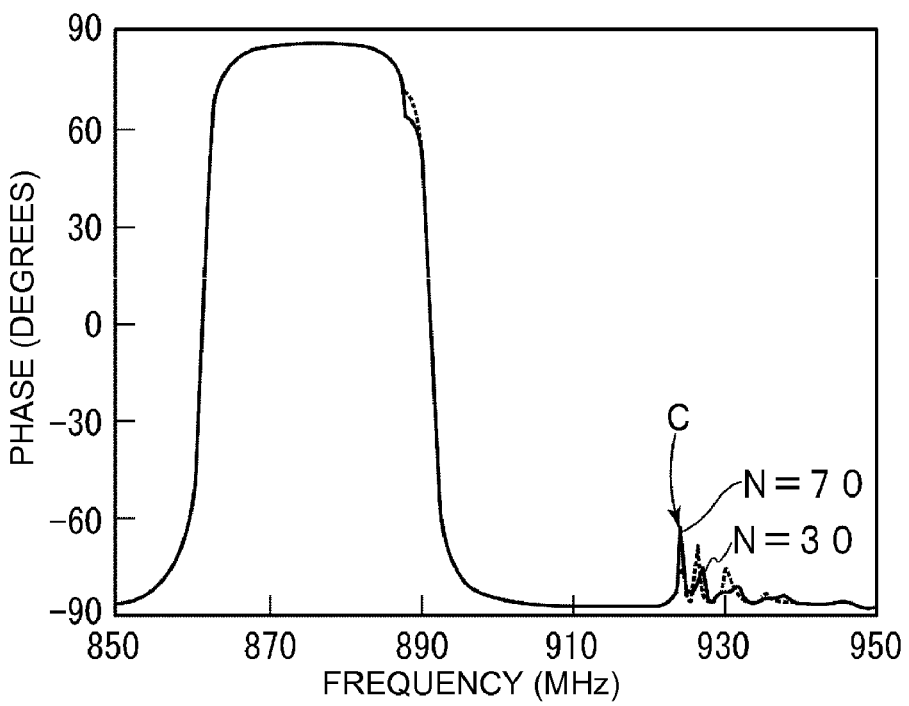

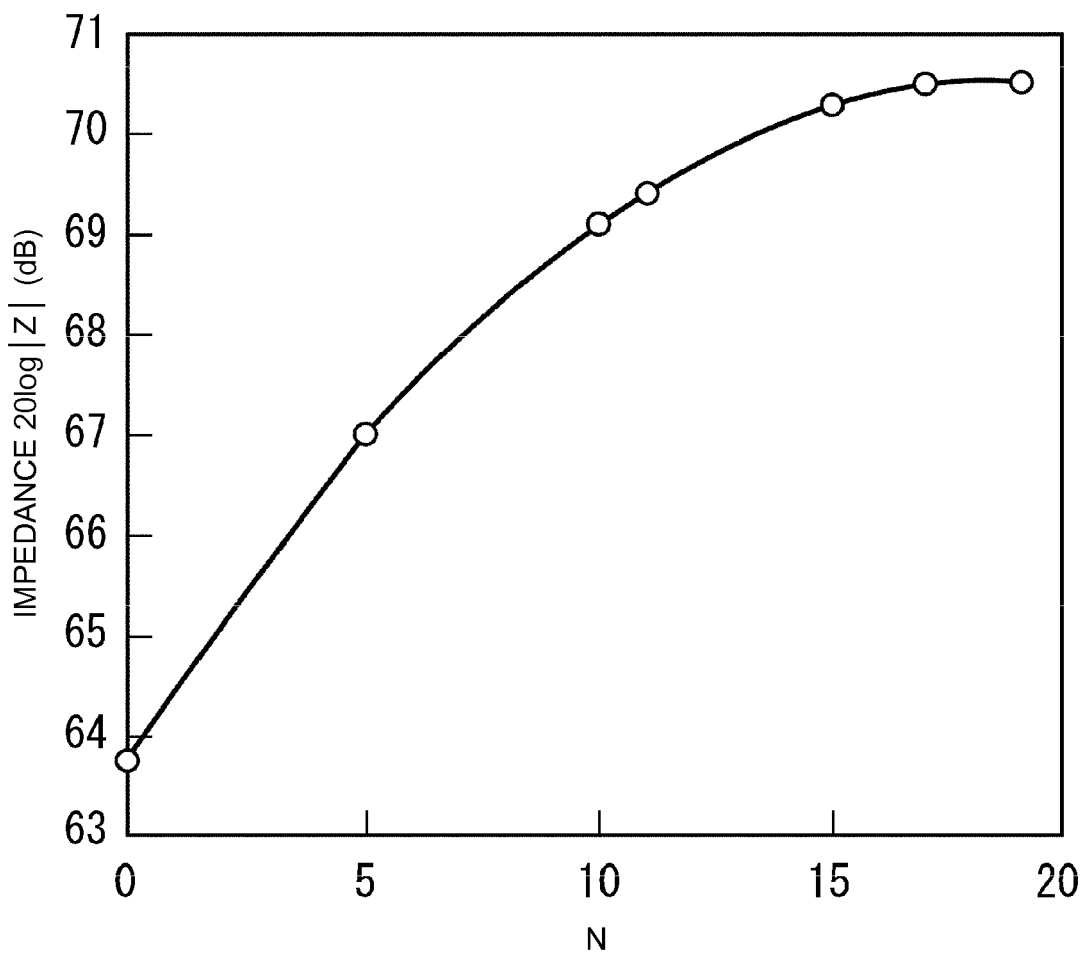

SURFACE ACOUSTIC WAVE RESONATOR AND LADDER-TYPE FILTER

BACKGROUND OF THE INVENTION

1. Field of the Invention

The present invention relates to a surface acoustic wave resonator in which reflectors are disposed adjacent to both ends in the surface acoustic wave propagation direction, of an IDT electrode, and a ladder-type filter including the surface acoustic wave resonator. In particular, the present invention relates to a surface acoustic wave resonator in which cross widths of an IDT electrode are weighted, and a ladder-type filter including the surface acoustic wave resonator.

2. Description of the Related Art

Surface acoustic wave resonators have been widely used in communication devices, such as cellular phones, so as to define resonators or filters.

For example, Japanese Unexamined Patent Application Publication No. 2000-286663 discloses a surface acoustic wave resonator 1001 shown in FIG. 14. The surface acoustic wave resonator 1001 includes an electrode structure provided on a piezoelectric substrate. The surface acoustic wave resonator 1001 is a surface acoustic wave resonator using Love waves having an electromechanical coupling coefficient k2 greater than that of Rayleigh waves.

In the surface acoustic wave resonator 1001, an IDT electrode 1002 is provided on the piezoelectric substrate. The IDT electrode 1002 includes a bus bar 1003 and a bus bar 1004 that is opposed to the bus bar 1003. The bus bar 1003 includes a bus bar portion 1003a extending in an inclined direction forming an angle of θ with the surface acoustic wave propagation direction and a bus bar portion 1003b extending in an inclined direction forming an angle of −θ with the surface acoustic wave propagation direction and connected to the bus bar portion 1003a.

Similarly, a second bus bar 1004 includes a bus bar portion 1004a extending in an inclined direction forming an angle of −θ with the surface acoustic wave propagation direction and a bus bar portion 1004b connected to the bus bar portion 1004a and extending in an inclined direction forming an angle of θ with the surface acoustic wave propagation direction.

The bus bar portions 1003a and 1003b and bus bar portions 1004a and 1004b form a substantial rhombus.

Multiple electrode fingers 1005 extend from the bus bar portions 1003a and 1003b toward the bus bar portions 1004a and 1004b. Dummy electrodes 1006 are arranged so as to oppose the tips of the electrode fingers 1005 with gaps therebetween. Ends of the dummy electrodes 1006 are connected to the second bus bar 1004 and the other ends thereof are opposed to the electrode fingers 1005 with the above-mentioned gaps therebetween.

Similarly, multiple electrode fingers 1007 including ends connected to the second bus bar 1004 and the other ends extending toward the first bus bar 1003 are provided. Dummy electrodes 1008 are disposed so as to oppose the tips of the electrode fingers 1007 with gaps therebetween in the length direction of the electrode fingers. Ends of the dummy electrodes 1008 are connected to the first bus bar 1003 and the other ends thereof are opposed to the electrode fingers 1007 with the above-mentioned gaps therebetween.

The electrode fingers 1005 and the electrode fingers 1007 are alternately disposed in the surface acoustic wave propagation direction. In addition, in the above-mentioned IDT electrode 1002, the cross widths are weighted. Based on this cross-width weighting, the cross width located at the center in the surface acoustic wave propagation direction is the greatest and cross widths located outward in the surface acoustic wave propagation direction are reduced therefrom.

In the surface acoustic wave resonator 1001, the cross width of the above-mentioned smallest cross width portion is zero. Areas in which only the dummy electrodes 1006 and 1008 exist are provided at the ends in the surface acoustic wave propagation direction.

A feature of the surface acoustic wave resonator 1001 is that the cross widths are weighted as described above and an envelope A obtained by the above-mentioned cross width weighting is in parallel with the inner edges of the bus bar portions 1003a, 1003b, 1004a, and 1004b. In other words, the inner edges of the bus bar portions 1003a to 1004b are disposed in parallel with the envelope. That is, the inner edges of the bus bar portions 1003a to 1004b are inclined at an angle of θ or −θ with the surface acoustic wave propagation direction. For this reason, resonance caused by a harmonic higher-order mode does not readily occur. This reduces spurious waves. Particularly, in Japanese Unexamined Patent Application Publication No. 2000-286663, portions between the above-mentioned envelope and the inner edges of the bus bars extending in parallel with the envelope function as reflectors. For this reason, for example, as shown by a straight line L in FIG. 15, an excited surface acoustic wave crosses, for example, five electrode fingers before reaching the inner edge of the bus bar portion 1003b. Since these five electrode fingers function as reflectors, spurious waves can be effectively restrained, which enables downsizing.

Surface acoustic wave resonators are used to define oscillation circuits, filters, and other suitable devices. To define a filter circuit, a plurality of surface acoustic wave resonators are typically connected. For example, in a ladder-type filter including a plurality of surface acoustic wave resonators, at least one surface acoustic wave resonator is connected to a series arm and at least one surface acoustic wave resonator is connected to a parallel arm. For a ladder-type filter, the attenuation is not sufficiently increased in a band higher than the passband if the impedance of the series arm resonator at the anti-resonance frequency is not sufficiently increased.

For a parallel arm resonator, insertion loss may increase in the passband if the impedance thereof at the anti-resonance frequency is not sufficiently increased.

However, for the surface acoustic wave resonator described in Japanese Unexamined Patent Application Publication No. 2000-286663, the impedance thereof at the anti-resonance frequency may not be sufficiently increased. There is also a problem in that return loss increases in a frequency band higher than the anti-resonance frequency, for example, at a frequency that is approximately 1.003 times the anti-resonance frequency. For this reason, insertion loss may increase in a band higher than the passband of a ladder-type filter using the surface acoustic wave resonator as a parallel arm resonator.

SUMMARY OF THE INVENTION

To overcome the problems describe above, preferred embodiments of the present invention provide a surface acoustic wave resonator that not only prevents spurious waves due to a harmonic higher-order mode resonance but also increases the impedance at the anti-resonance frequency, and a ladder-type filter including the surface acoustic wave resonator as a parallel arm resonator and reduces insertion loss in a band higher than the passband.

A surface acoustic wave resonator according to a preferred embodiment of the present invention includes a piezoelectric substrate, an IDT electrode provided on the piezoelectric substrate, and a pair of reflectors provided adjacent to both ends, in a surface acoustic wave propagation direction, of the IDT electrode. The IDT electrode includes first and second bus bars, a plurality of first electrode fingers extending from the first bus bar toward the second bus bar, a plurality of second electrode fingers extending from the second bus bar toward the first bus bar, first dummy electrodes opposed to tips of the first electrode fingers with gaps therebetween and connected to the second bus bar, and second dummy electrodes opposed to tips of the second electrode fingers with gaps therebetween and connected to the first bus bar.

Preferably, the IDT electrode is subjected to cross-width weighting so that the IDT electrode has a cross width-weighted portion in which electrode finger cross widths of the IDT electrode are reduced as the cross widths move away from a portion having the greatest cross width and come closer to both ends in the surface acoustic wave propagation direction, of the IDT electrode, an edge of the first bus bar to which the first electrode fingers and the second dummy electrodes are connected includes an inclined portion that is inclined relative to the surface acoustic wave propagation direction so that the edge is spaced a predetermined distance away from an envelope obtained by the cross width weighing, an edge of the second bus bar to which the second electrode fingers and the first dummy electrodes are connected includes an inclined portion that is inclined relative to the surface acoustic wave propagation direction so that the edge is spaced a predetermined distance away from the envelope obtained by the cross width weighing, a length of an electrode finger of one of the reflectors adjacent to an outermost electrode of the IDT electrode is approximately equal to a sum of a length of the outermost electrode finger of the IDT electrode and a length of a dummy electrode opposed to a tip of the outermost electrode finger, and if a sum of the number of electrode fingers and dummy electrodes that is crossed by a straight line from a tip of at least one electrode finger of the IDT electrode in the surface acoustic wave propagation direction before reaching one of the edge of the first bus bar and the edge of the second bus bar is represented by N, N is at least 11, for example, and the number of electrode fingers included in one of the pair of reflectors is approximately N, for example.

N is more preferably at least 17, for example. In this case, the use of the surface acoustic wave resonator as a parallel arm resonator of a ladder-type filter further increases the impedance at the anti-resonance frequency and thereby reduces the return loss at frequencies on the right shoulder of the passband.

In the surface acoustic wave resonator according to a preferred embodiment of the present invention, the above-mentioned N is preferably 30 or less, for example. This effectively reduces ripples that appear in a stopband around the edge of a band higher than the passband and thereby increasing electric power resistance.

A ladder-type filter according to a preferred embodiment of the present invention includes series arm resonators and parallel arm resonators. At least two resonators of the series arm resonators and the parallel arm resonators are defined by the surface acoustic wave resonators configured according to preferred embodiments of the present invention described above.

The ladder-type filter according to a preferred embodiment of the present invention preferably includes first and second surface acoustic wave resonators arranged so that surface acoustic wave propagation directions thereof are parallel or substantially parallel to each other, as the at least two surface acoustic wave resonators. Further, an outer edge of one of the first and second bus bars of one of the first and second surface acoustic wave resonators that is opposed to an edge to which one of the first and second electrode fingers and one of the second and first dummy electrodes are connected is preferably inclined so that the outer edge is spaced a predetermined distance away from the envelope, and the second bus bar of the second surface acoustic wave resonator is preferably located outside the outer edge of the first bus bar of the first surface acoustic wave resonator in a direction perpendicular or substantially perpendicular to the surface acoustic wave propagation direction. This allows further downsizing the ladder-type filter.

In the surface acoustic wave resonator according to a preferred embodiment of the present invention, the edge of the first bus bar to which the first electrode fingers and the second dummy electrodes are connected preferably includes the inclined portion that is inclined so that the edge is spaced a predetermined distance away from the envelope obtained by the cross width weighing. Similarly, the edge of the second bus bar to which the second electrode fingers and the first dummy electrodes are connected also includes the inclined portion. Accordingly, similar to the surface acoustic wave resonator described in Japanese Unexamined Patent Application Publication No. 2000-286663, resonance caused by a harmonic higher-order mode does not readily occur and spurious waves due to a harmonic higher-order mode can be effectively reduced. Also, in a preferred embodiment of the present invention, if the sum of the number of electrode fingers and dummy electrodes crossed by a straight line extending from the tip of at least one electrode finger of the above-mentioned IDT electrode in the surface acoustic wave propagation direction before reaching the edge of the first or second bus bar is represented by N, N is preferably at least 11, for example, and the number of electrode fingers included in one of the pair of reflectors is preferably approximately N. This enables the impedance at the anti-resonance frequency to be sufficiently increased.

Accordingly, the use of the surface acoustic wave resonator according to preferred embodiments of the present invention as a series arm resonator in a ladder-type filter configured using the surface acoustic wave resonator enables the impedance at the anti-resonance frequency to be increased and thereby to sufficiently increase the attenuation in a band higher than the passband. Further, return loss in a band higher than the passband can be reduced. Also, the use of the above-mentioned surface acoustic wave resonator as a parallel arm resonator enables the insertion loss in the passband to be sufficiently reduced. This provides a ladder-type filter having excellent filter characteristics.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 8A and 8B are graphs showing impedance-frequency characteristics and phase-frequency characteristics of the surface acoustic wave resonators in the case in which N=30 and a case in which N=70.

FIG. 10 is a graph showing variations in impedance at the anti-resonance frequency shown when changing the N.

DETAILED DESCRIPTION OF THE PREFERRED EMBODIMENTS

Hereafter, the present invention will be clarified by describing specific preferred embodiments thereof with reference to the accompanying drawings.

Figure 1:
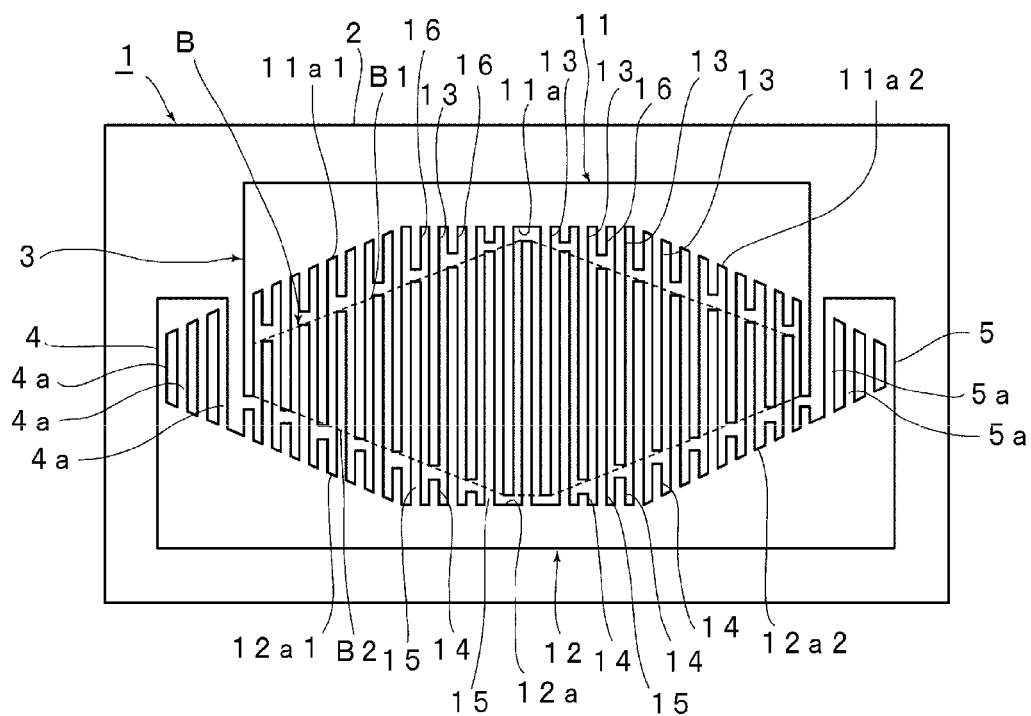
FIG. 1 is a plan view schematically showing a piezoelectric resonator according to a preferred embodiment of the present invention.

FIG. 1 is a plan view showing a surface acoustic wave resonator according to a preferred embodiment of the present invention. A surface acoustic wave resonator 1 includes a piezoelectric substrate 2. The piezoelectric substrate 2 is preferably a $LiNbO_3$ substrate having a cut angle 126°, for example. However, the piezoelectric substrate 2 may be made of another piezoelectric monocrystal, such as $LiTaO_3$ or quartz crystal, for example, or may be made of piezoelectric ceramic, such as lead zirconate titanate ceramic, for example.

Figure 3:
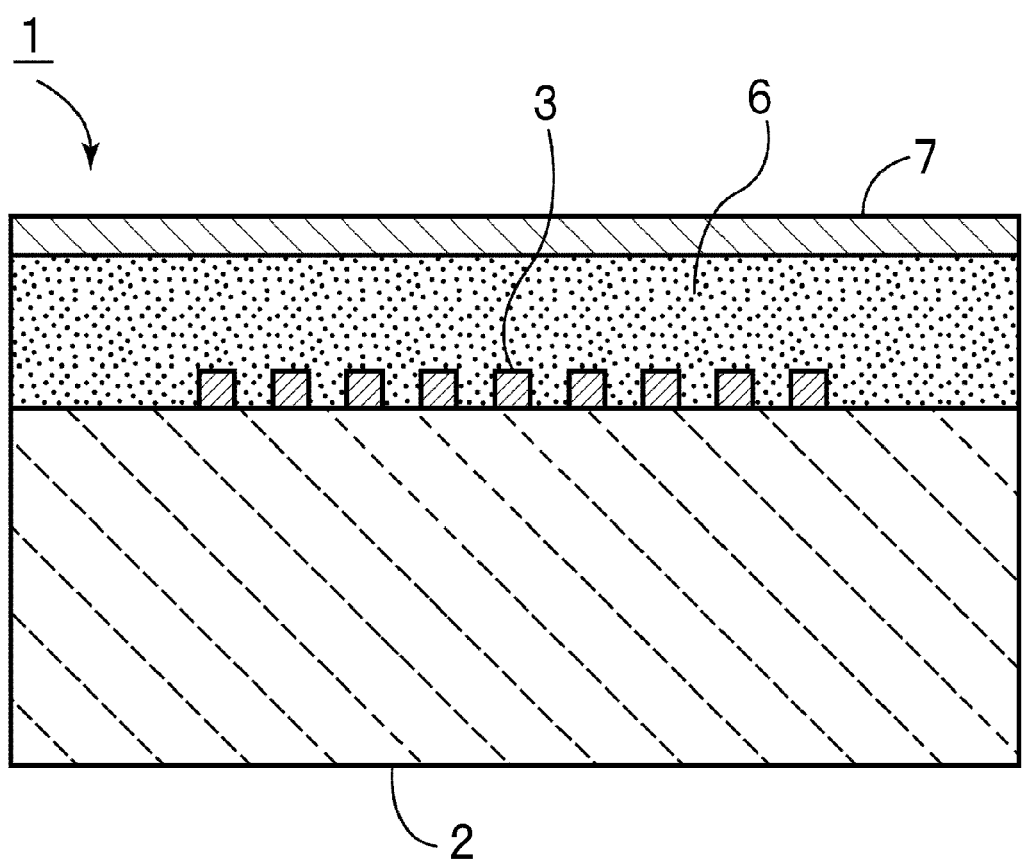
FIG. 3 is a schematic front sectional view showing a multilayer structure of the surface acoustic wave element according to the preferred embodiment shown in FIG. 1.

The piezoelectric substrate 2 includes an electrode structure shown in FIG. 1 provided thereon. Specifically, an IDT electrode 3 and reflectors 4 and 5 are arranged adjacent to both ends of the IDT electrode 3 in the surface acoustic wave propagation directions. Although not shown in FIG. 1, an $SiO_2$ film 6 and an SiN film 7, for example, are preferably laminated in that order so as to cover the electrode structure including the IDT electrode 3, as shown in FIG. 3.

An important feature of the surface acoustic wave resonator 1 according to this preferred embodiment is the electrode structure including the IDT electrode 3 and reflectors 4 and 5.

Specifically, the IDT electrode 3 includes a first bus bar 11 and a second bus bar 12 arranged to be opposed to the first bus bar 11. A plurality of first electrode fingers 13 extend from an inner edge 11a of the first bus bar 11 toward the second bus bar 12. First dummy electrodes 14 are opposed to the tips of the first electrode fingers 13 with gaps therebetween. Specifically, the first dummy electrodes 14 extending in the extending direction of the first electrode fingers 13 are opposed to the tips of the first electrode fingers 13 with the gaps therebetween. Ends of the first dummy electrodes 14 are connected to an inner edge 12A of the second bus bar 12 and the other ends thereof are opposed to the first electrode fingers 13 with the above-mentioned gaps therebetween.

Similarly, second electrode fingers 15 are arranged to extend from the inner edge 12A of the second bus bar 12 towards the first bus bar 11. Second dummy electrodes 16 are opposed to the tips of the second electrode fingers 15 with gaps therebetween. Ends of the second dummy electrodes 16 are connected to the inner edge 11a of the first bus bar 11 and the other ends thereof are opposed to the tips of the second electrode fingers 15 with the above-mentioned gaps therebetween.

In the above-mentioned IDT electrode 3, the cross widths are weighted. The weighting is performed so that a cross width located at the center of the IDT electrode 3 in the surface acoustic wave propagation direction, that is, in a direction perpendicular to the extending direction of the electrode fingers 13 and 15 is the largest and cross widths closer to both edges of the IDT electrode 3 in the surface acoustic wave propagation direction are reduced.

Accordingly, an envelope portion B1 adjacent to the first bus bar 11 of an envelope B surrounding the cross width area gets closer to an envelope portion B2 adjacent to the second bus bar 12 as the envelope portion B1 moves from the center of the IDT electrode 3 leftward. Similarly, the envelope portion B1 gets closer to the envelope portion B2 located adjacent to the second bus bar 12 as it moves from the center of the IDT electrode 3 rightward.

In contrast, the center in the surface acoustic wave propagation direction of the second envelope portion B2 is located most outwardly in a direction perpendicular to the surface acoustic wave propagation direction. The second envelope portion B2 gets closer to the first envelope portion B1 as it gets closer to both ends thereof in the surface acoustic wave propagation direction.

On the other hand, the inner edge 11a includes inclined portions 11a1 and 11a2 so that the distance between the inner edge 11a of the first bus bar 11 and the envelope portion B1 adjacent to the first bus bar 11 is approximately constant. Similarly, the inner edge 12a of the second bus bar 12 also includes inclined portions 12a1 and 12a2. The inclined portions 12a1 and 12a2 extend parallel or substantially parallel to the above-mentioned envelope portion B2.

Accordingly, in the IDT electrode 3, the lengths of dummy electrodes and electrode finger portions that function as reflectors in an area outside of the cross width area in a direction perpendicular to surface acoustic waves are relatively short, as in the surface acoustic wave resonator 1001 described in Japanese Unexamined Patent Application Publication No. 2000-286663. Accordingly, since the area that functions as the reflectors with respect to the group velocity direction of surface acoustic waves is inclined, a harmonic higher-order mode resonance does not readily occur. This reduces spurious waves caused by a harmonic higher-order mode resonance.

The reflectors 4 and 5 include a plurality of electrode fingers 4a and a plurality of electrode fingers 5a, respectively. The electrode fingers 4a and 5a are shorted at both ends. The electrode fingers 4a and 5a extend parallel or substantially parallel to the electrode fingers 13 and 15 of the IDT electrode 3.

The length of an electrode finger 4a of the reflector 4 or an electrode finger 5a of the reflector 5 adjacent to an outermost electrode finger 13 or 15 of the IDT electrode 3 in the surface acoustic wave propagation direction is approximately equal to the sum of the length of the outermost electrode finger and the length of a second dummy electrode 14 or first dummy electrode 16 opposed to the tip of the outermost electrode finger.

Figure 2:
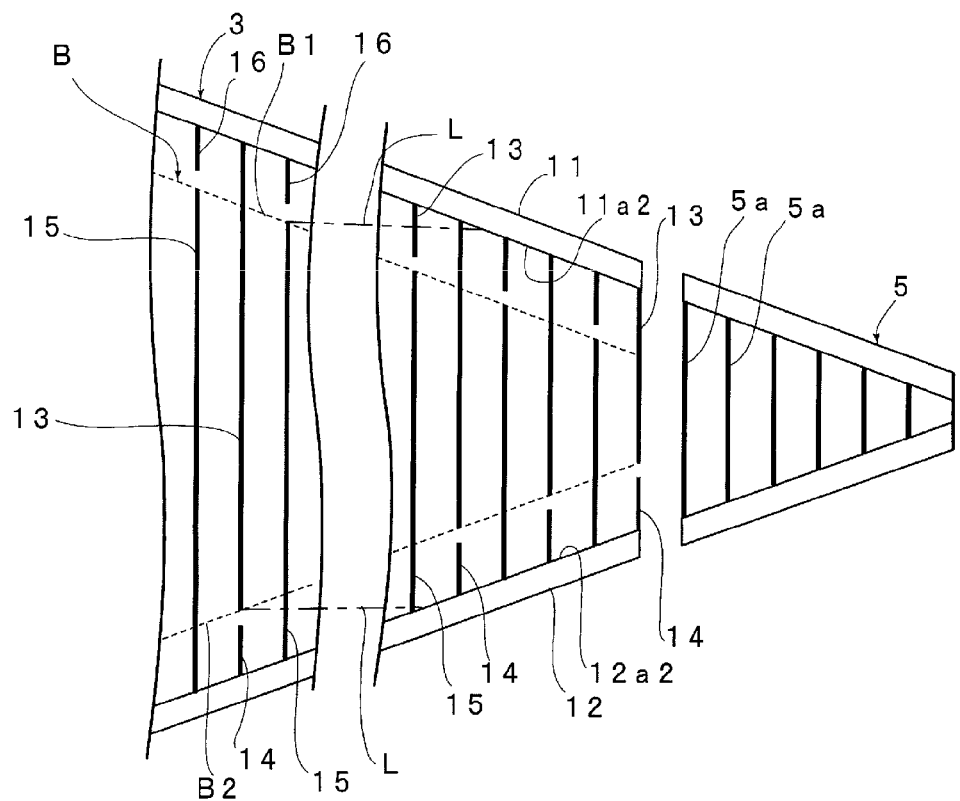
FIG. 2 is a partially enlarged plan view of an electrode structure showing a major portion of the surface acoustic wave resonator shown in FIG. 1.

A feature of the surface acoustic wave resonator 1 according to this preferred embodiment is that spurious waves caused by a harmonic higher-order mode can be suppressed since the inner edge 11a and inner edge 12a of the first bus bar 11 and second bus bar 12 have the inclined portions 11a1 and 11a2 and inclined portions 12a1 and 12a2 extending approximately in parallel to the envelope portion B1 or envelope portion B2 of the envelope obtained by performing the cross width weighting as described above. Another feature thereof is that, as shown in FIG. 2, the sum of the numbers of electrode fingers and dummy electrodes that a straight line L extending from the tip of at least one electrode finger 13 or 15 in the surface acoustic wave propagation direction crosses before reaching the inner edge 11a of the first bus bar 11 or the inner edge 12a of the second bus bar 12 is represented by N, the N is preferably equal to or greater than 11, for example, and the number of the electrode fingers 4a or 5a included in one of the reflectors 4 and 5 is preferably approximately N, for example. This enables a sufficient increase in the impedance at the anti-resonance frequency. Also, when a ladder-type filter used as series arm resonators or parallel arm resonators of a ladder-type filter is provided, characteristics in a band higher than the passband can be improved and return loss can be reduced. This will be described on the basis of specific example experiments.

EXAMPLE EXPERIMENT 1

As the piezoelectric substrate 2, an $SiO_2$ film was provided on an $LiNbO_3$ substrate having a cut angle of 126° with a thickness of about 220 nm. Subsequently, a resist pattern was provided on the $SiO_2$ film excluding an electrode formation portion. Then, etching was performed to eliminate the $SiO_2$ film on the electrode formation portion. Then, a metallic film for forming an electrode was formed on the entire surface of the substrate. As the metallic film for forming an electrode, a multilayer metallic film in which metals or alloys, AlCu, Ti, Pt, and NiCr, were laminated, was formed. The thicknesses of AlCu, Ti, Pt, and NiCr were about 100 nm, about 10 nm, about 80 nm, and about 10 nm, respectively. The wavelength determined by the electrode finger pitch of the IDT electrode 3 was about 4 μm and the duty ratio was about 0.5. The number of electrode finger pairs of the IDT electrode 3 was 88. The cross width of the largest cross width portion was about 80 μm and the cross width of the smallest cross width portion was about 8 μm. The widths of the gaps located at the tips of the first and second electrode fingers, that is, the sizes of the gaps in a direction perpendicular to the surface acoustic wave propagation direction were about 0.4 μm. The lengths of the first dummy electrode 14 and second dummy electrode 16 located at the center of the IDT electrode 3 were zero. The lengths of the dummy electrodes located at both ends in the surface acoustic wave propagation direction, of the IDT electrode 3 were in proportion to the number of dummy electrodes, and were about 7.4 μm when the total number of second dummy electrodes was 17. Similarly, for the reflectors 4 and 5, the wavelengths determined by the electrode finger pitch were about 4 μm and the duty ratio was about 0.5. The number of electrode fingers of the reflectors 4 or 5 was set to be the same as N of the IDT electrode 3. The aperture length of the electrode fingers of the reflectors 4 and 5 was set to substantially the aperture length of the ends of the IDT electrode 3 in the surface acoustic wave propagation direction, that is, substantially to the sum of the cross width and twice the length of the dummy electrode.

An $SiO_2$ film having a thickness of about 1000 nm was arranged so as to cover the above-mentioned IDT electrode and reflectors. Also, the SiN film 7 was provided to adjust the frequency and had a thickness of about 50 mm.

By performing the above-mentioned surface acoustic wave resonator manufacturing method, surface acoustic wave resonators each having a structure in which the number of electrode fingers of the IDT is 88 and N is 5, N is 11, and N is 19, respectively, were manufactured. For comparison, a surface acoustic wave resonator in which N is 0 was also manufactured.

The resonance characteristics of the surface acoustic wave resonators obtained in the above-mentioned manner were measured.

Figure 4A:
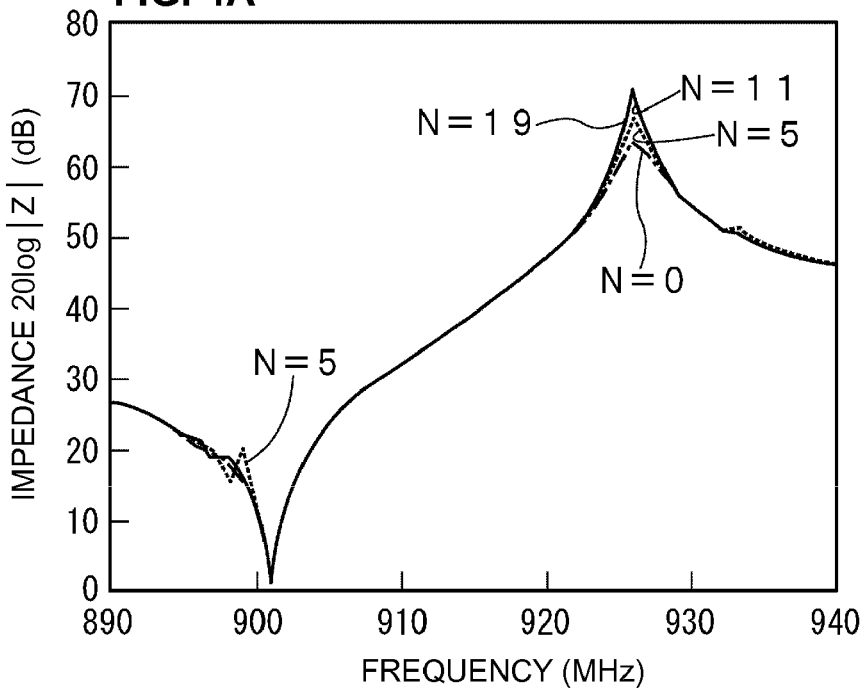
FIGS. 4A and 4B are drawings showing impedance-frequency characteristics and phase-frequency characteristics of surface acoustic wave resonators according to an example of a preferred embodiment of the present invention and a comparative example.
Figure 4B:
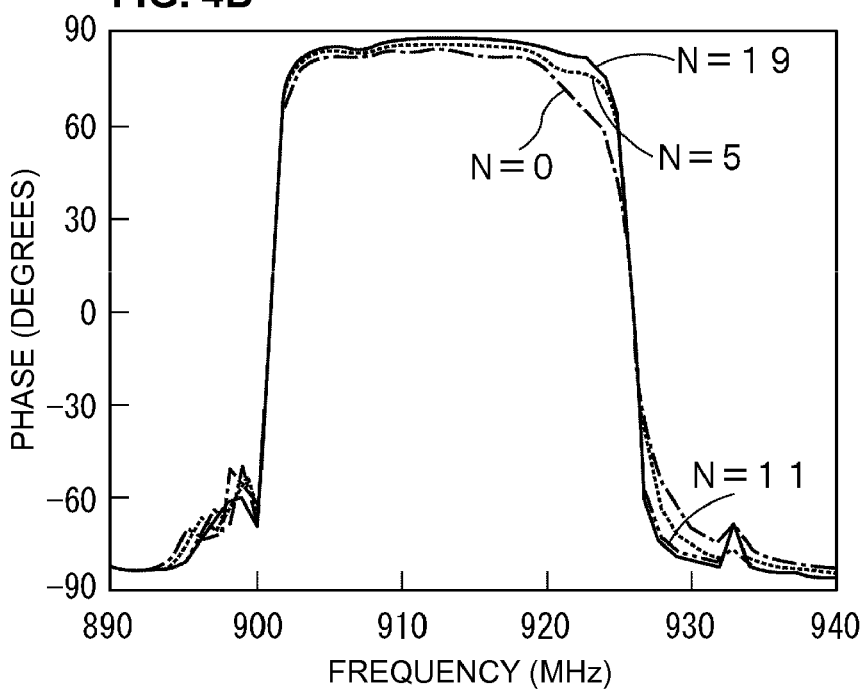

FIGS. 4A and 4B show impedance-frequency characteristics and phase-frequency characteristics of the surface acoustic wave resonators having N of 0, N of 5, N of 11, and N of 19, respectively.

Figure 5A:
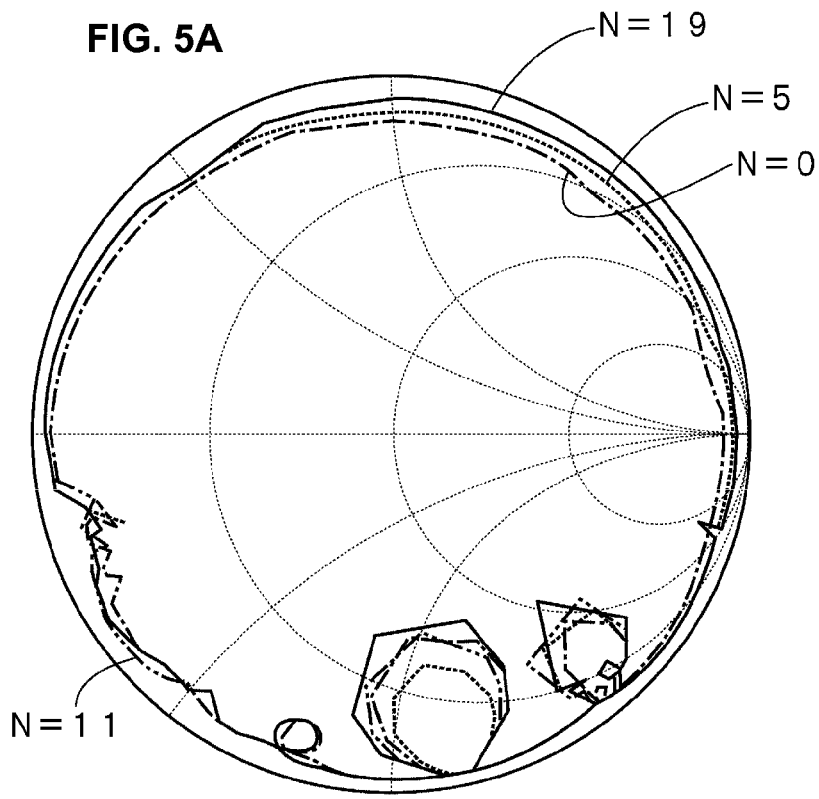
FIG. 5A is an impedance Smith charts indicating impedance characteristics of the surface acoustic wave resonators according to a preferred embodiment of the present invention and a comparative example and FIG. 5b is a drawing showing return loss-frequency characteristics thereof.
Figure 5B:
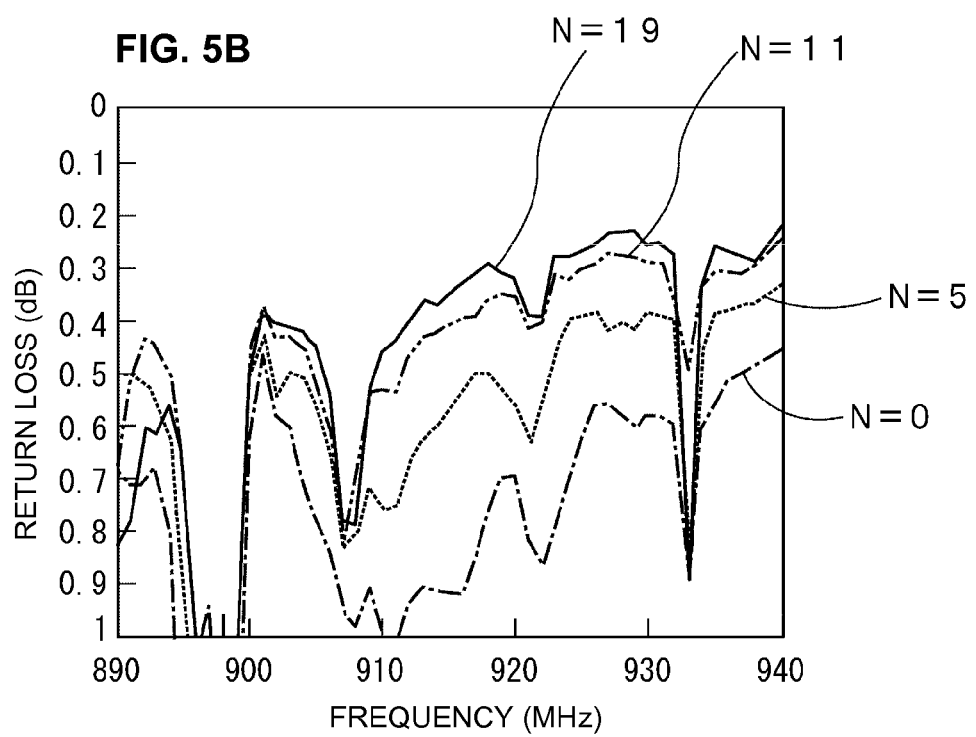

FIG. 5A is an impedance Smith chart indicating frequency characteristics of the surface acoustic wave resonators having N of 0, N of 5, N of 11, and N of 19, respectively, and FIG. 5B is shows return loss-frequency characteristics thereof.

In FIGS. 4A to 5B, solid lines indicate the results of the case in which N=19, broken lines indicate the results of the case in which N=11, alternate long and short dashed lines indicate the results of the case in which N=5, and chain double-dashed lines indicate the result of the case in which N=0.

From FIGS. 4A and 4B and FIGS. 5A and 5B, it is understood that the impedance at the anti-resonance frequency in the case in which N=11 and the case in which N=19 is sufficiently greater than that in the case in which N=0 or case in which N=5. It is also understood that the return loss in the case in which N=11 and the case in which N=19 is less than that in the case in which N=0 or case in which N=5. It is also understood that the return loss in the case in which N=19 is less than that in the case in which N=11.

EXAMPLE EXPERIMENT 2

An example experiment 2 was performed in a similar manner as example experiment 1. However, the number of electrode finger pairs of the IDT electrode 3 was 111, the cross width of the largest cross width portion was about 100 μm, and the cross width of the smallest cross width portion was about 10 μm. Surface acoustic wave resonators having N of 13, 17, 21, 30, and 70 were manufactured. For comparison, a surface acoustic wave resonator having N of 0 was manufactured. Other than these differences, the example experiment 2 was substantially the same as the example experiment 1.

Figure 6A:
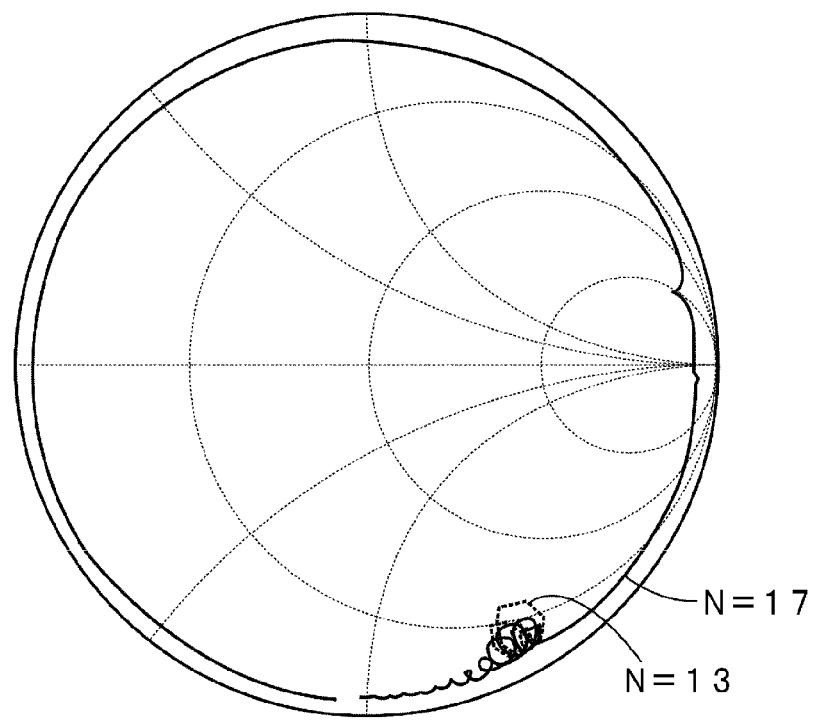
FIG. 6A is an impedance Smith chart indicating impedance characteristics of the surface acoustic wave resonators in a case in which N=13 and a case in which N=17 and FIG. 6B is a drawing showing return loss-frequency characteristics thereof.
Figure 6B:
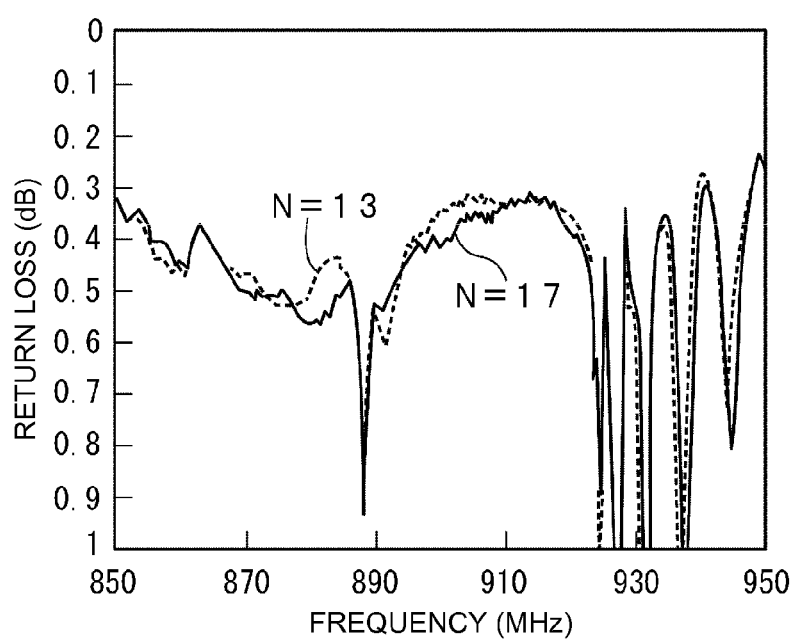

FIG. 6A is an impedance Smith chart indicating frequency characteristics of the surface acoustic wave resonators having N of 13 and N of 17 and FIG. 6B is a drawing showing return loss-frequency characteristics thereof.

In FIGS. 6A and 6B, solid lines indicate the results of the case in which N=13 and broken lines indicate the result of the case in which N=17.

From FIGS. 6A and 6B, it is understood that the return loss in the case in which N=17 is much less than that in the case in which N=13. Accordingly, from the results shown in FIG. 5A and FIG. 6B, it is understood that the N is preferably at least 17, such that the return loss can be further reduced.

Figure 7A:
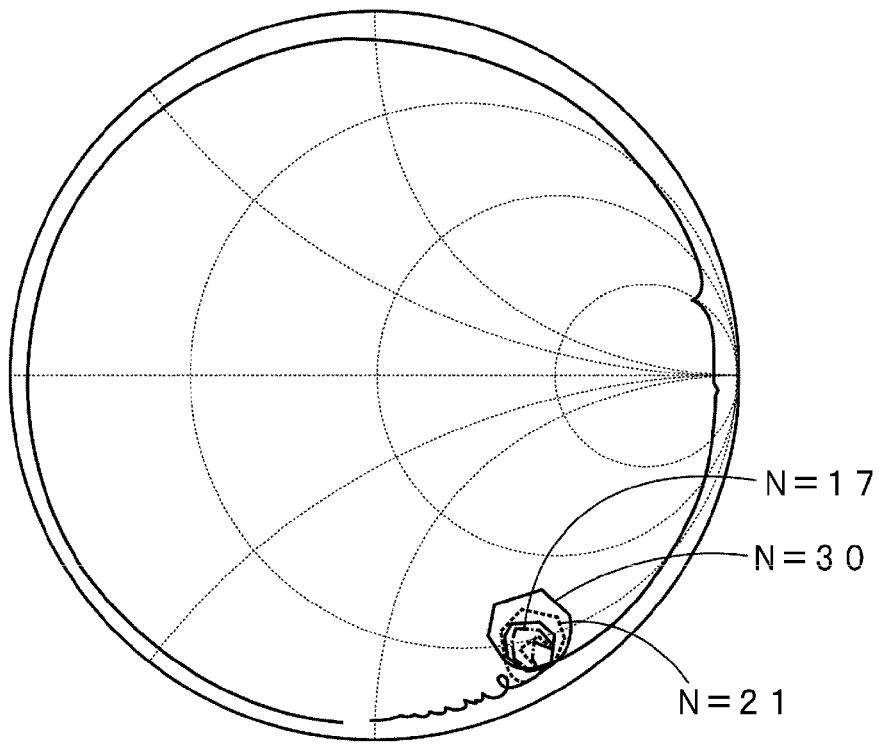
FIG. 7A is an impedance Smith charts indicating impedance characteristics of the surface acoustic wave resonators in the case in which N=17, a case in which N=21, and a case in which N=30
Figure 7B:
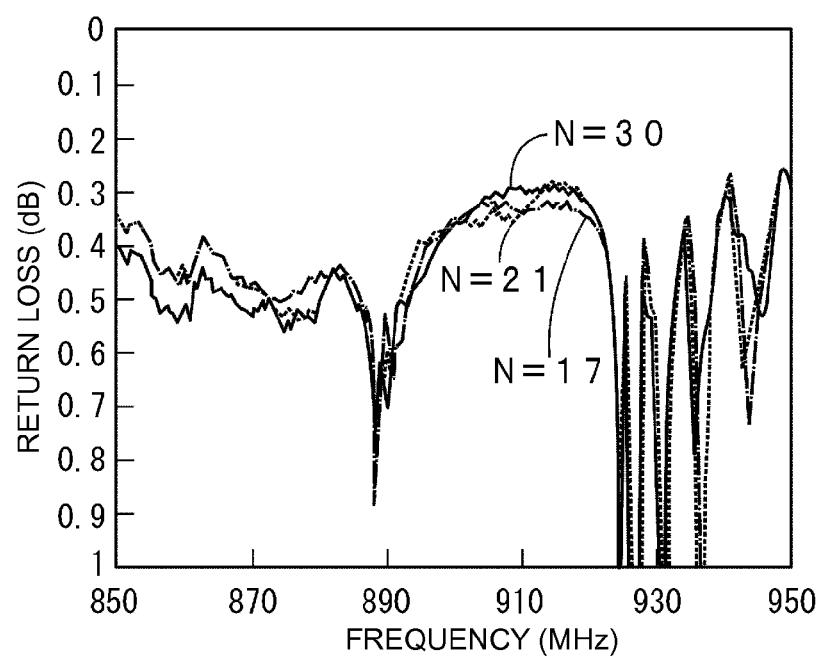
FIG. 7B is a drawing showing return loss-frequency characteristics thereof.

Also, as shown in FIGS. 7A and 7B, there was almost no difference in characteristics among the case in which N=17, the case in which N=21, and the case in which N=30, that is, in the range in which N is 17 to 30.

Figure 9A:
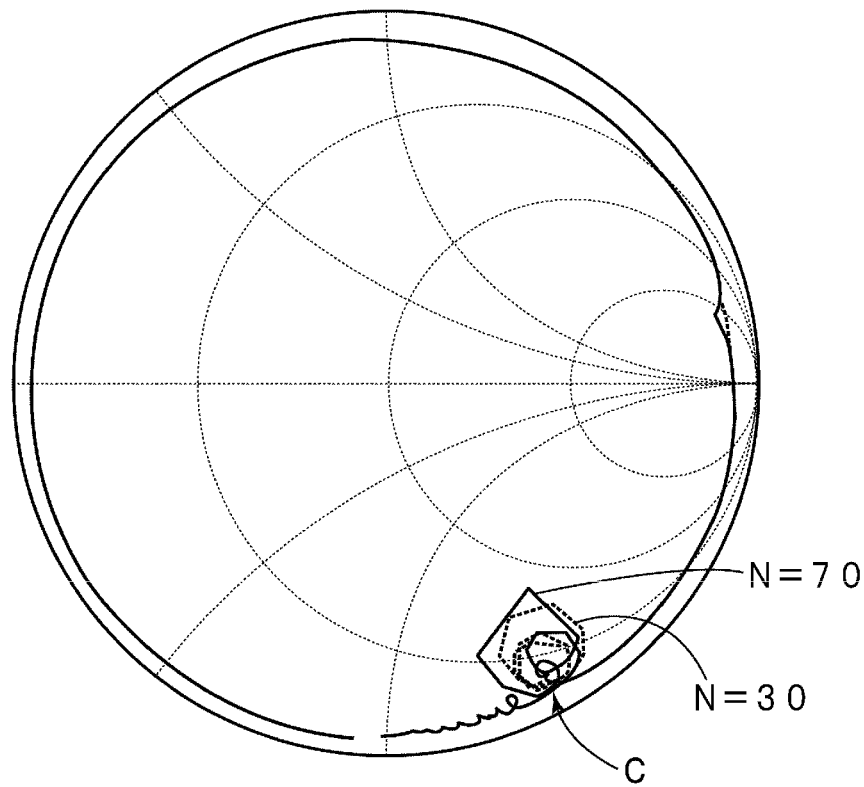
FIG. 9A is an impedance Smith charts indicating impedance characteristics of the surface acoustic wave resonators in the case in which N=30 and the case in which N=70 and FIG. 9B is a drawing showing return loss-frequency characteristics thereof.
Figure 9B:
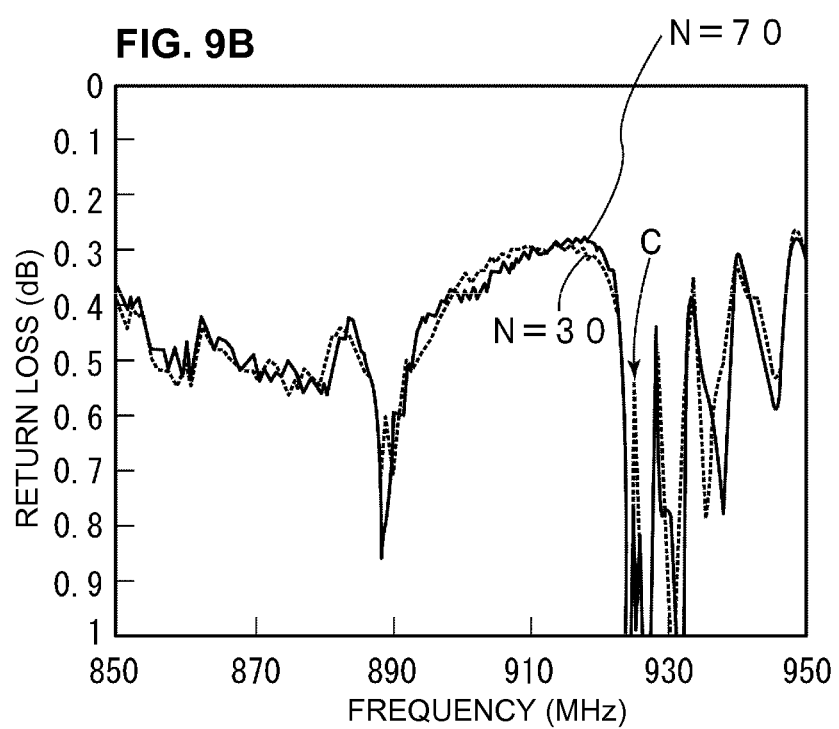

FIGS. 8A and 8B show impedance-frequency characteristics and phase-frequency characteristics of the surface acoustic wave resonators having N of 30 and N of 70. FIG. 9A is an impedance Smith chart indicating impedance characteristics of the surface acoustic wave resonators having N of 70 and N of 30 and FIG. 9B is a drawing showing return loss-frequency characteristics thereof.

From FIGS. 8A and 8B and FIGS. 9A and 9B, it is understood that, as shown an arrow C, ripples in the vicinity of about 925 MHz to about 935 MHz are increased in the case in which N=70 than in the case in which N=30. Accordingly, for example, if the surface acoustic wave resonator in which N=70 is used as a parallel arm resonator of a ladder-type filter, such an increase in ripple may cause a reduction in electric power resistance. Accordingly, N is preferably sent to 30 or less to reduce the above-mentioned ripples.

As seen, by setting N to at least 11 in the surface acoustic wave resonator 1, the impedance at the anti-resonance frequency can be sufficiently increased. Accordingly, if the surface acoustic wave resonator 1 is used as a series arm resonator of a ladder-type filter, the attenuation in a band higher than the passband can be sufficiently increased. If such a resonator is used as a parallel arm resonator, an increase in insertion loss in the passband can be prevented.

Also, it is understood that if N is set to at least 17, the return loss around the passband in a band higher than the anti-resonance frequency can be reduced, and thus, a ladder-type filter having much better filter characteristics can be obtained.

Further, it is understood that by setting N to 30 or less as described above, ripples in a band higher than the anti-resonance frequency can be reduced, and thus, if the surface acoustic wave resonator is used as a parallel arm resonator, out-of-band ripples around the edge of a band higher than the passband of a ladder-type filter can be favorably reduced.

Accordingly, the surface acoustic wave resonator obtained according to preferred embodiments of the present invention is favorably used as a parallel arm resonator or series arm resonator of a ladder-type filer.

FIG. 10 is a graph showing variations in impedance of the surface acoustic wave resonator at the anti-resonance frequency shown when values of N are changed. From FIG. 10, it is understood that when N is at least 11, the impedance can be sufficiently increased and, in particular, by setting N to at least 15, and more preferably, to at least 17, the impedance at the anti-resonance frequency can be further increased.

Preferred Embodiment of Ladder-type Filter

Figure 11:
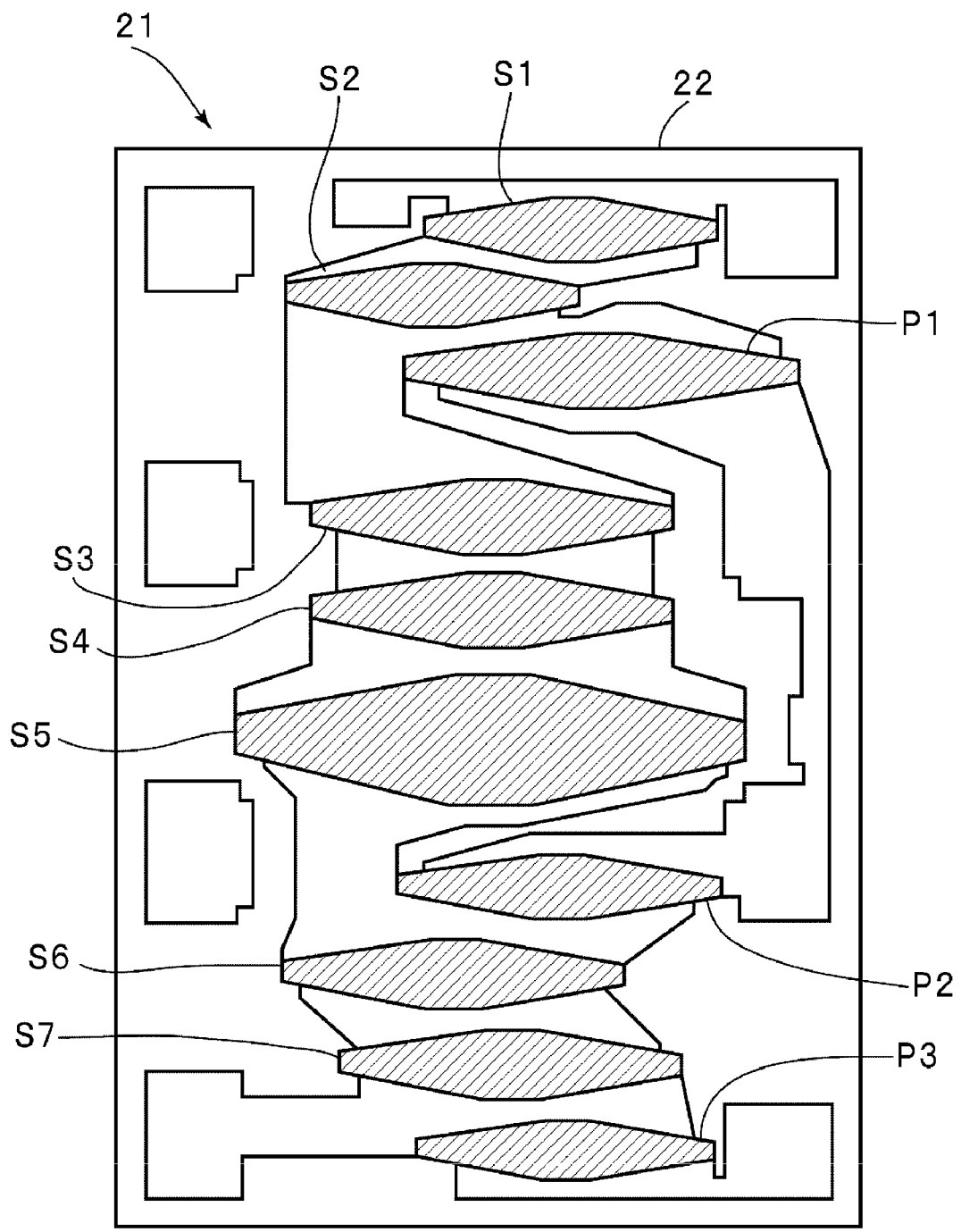
FIG. 11 is a schematic plan view showing a ladder-type filter according to another preferred embodiment of the present invention.

FIG. 11 is a schematic plan view showing a ladder-type filter according to another preferred embodiment of the present invention. The electrode structure shown in FIG. 1 is provided in hatched portions shown in FIG. 11. The ladder-type filter according to this preferred embodiment is preferably used as a GSM transmission filter, for example, preferably having a center frequency of 897.5 MHz and a passband of 880 MHz to 915 MHz. Note that the SiO$_2$ film and SiN film provided in the above-mentioned surface acoustic wave resonator are omitted in FIG. 11. However, the SiO$_2$ film 6 or SiN film 7 does not always need to be provided in the surface acoustic wave resonator according to preferred embodiments of the present invention and the ladder-type filter including the surface acoustic wave resonator.

Figure 12:
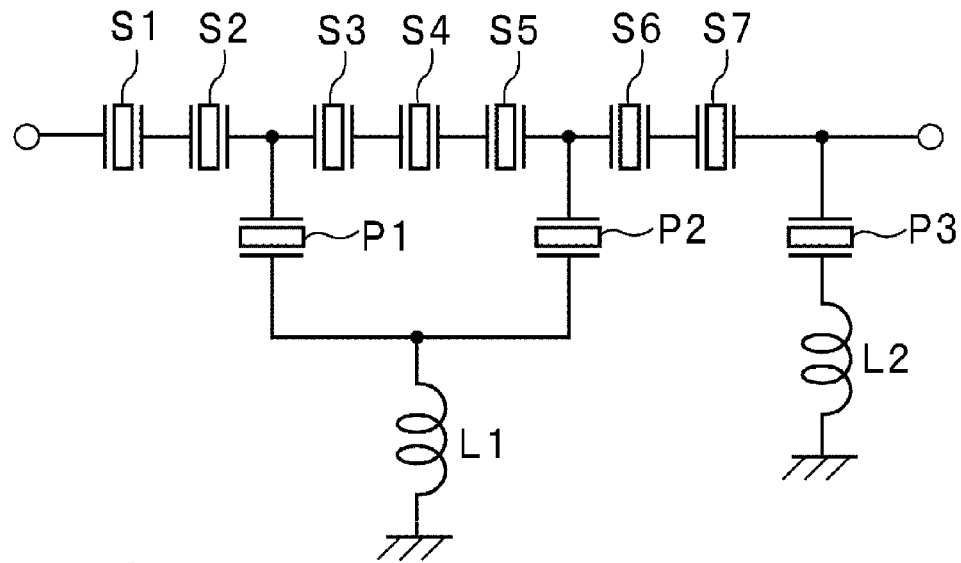
FIG. 12 is a diagram showing a circuit configuration of the ladder-type filter shown in FIG. 11.

As shown in FIG. 11, in a ladder-type filter 21, series arm resonators S1 to S7 are provided on a piezoelectric substrate 22. Further, parallel arm resonators P1 to P3 are provided on the piezoelectric substrate 22. By connecting the series arm resonators S1 to S7 and parallel arm resonators P1 to P3 as shown in FIG. 12, the ladder-type filter 21 is provided. An inductance L1 shown in FIG. 12 is provided by an inductance element inserted between the parallel arm resonators P1 and P2 and a ground potential or inductances provided by wiring lines. Similarly, an inductance L2 inserted between the parallel arm resonator P3 and a ground potential is provided by an independently connected inductance element or an inductance provided by a wiring line.

In the ladder-type filter 21 as described above, the series arm resonators S1 to S7 and parallel arm resonators P1 to P3 are defined by the surface acoustic wave resonators according to preferred embodiments of the present invention. Thus, the impedances of the surface acoustic wave resonators at the anti-resonance frequency are sufficiently increased. This enables improving the attenuation characteristics in a band higher than the passband, as well as reducing the return loss in an attenuation band of a band higher than the passband. Thus, good filter characteristics can be obtained.

Figure 13:
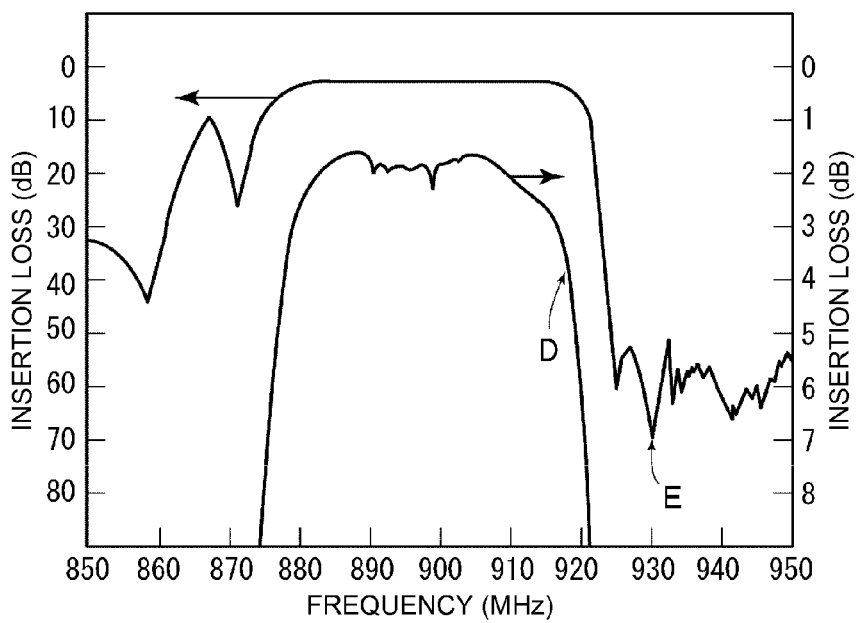
FIG. 13 is a graph showing a filter characteristic of the ladder-type filter shown in FIG. 11.
Figure 14:
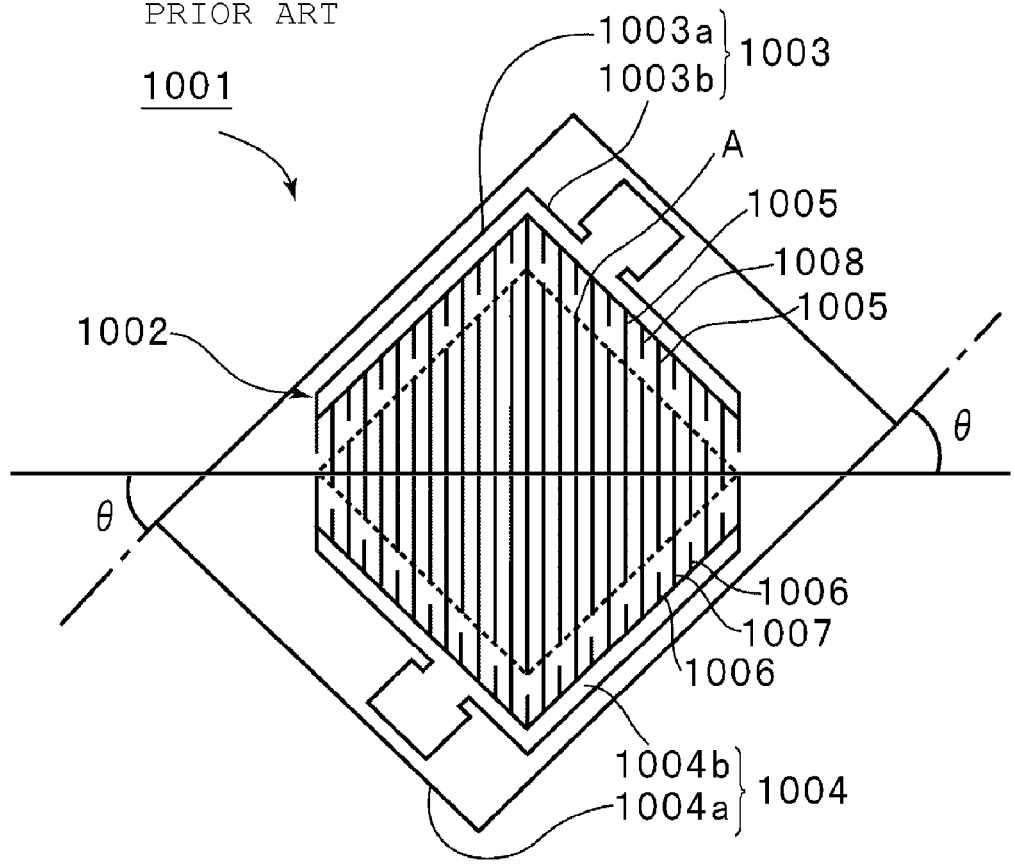
FIG. 14 is a plan view showing an example of a related-art surface acoustic wave resonator.
Figure 15:
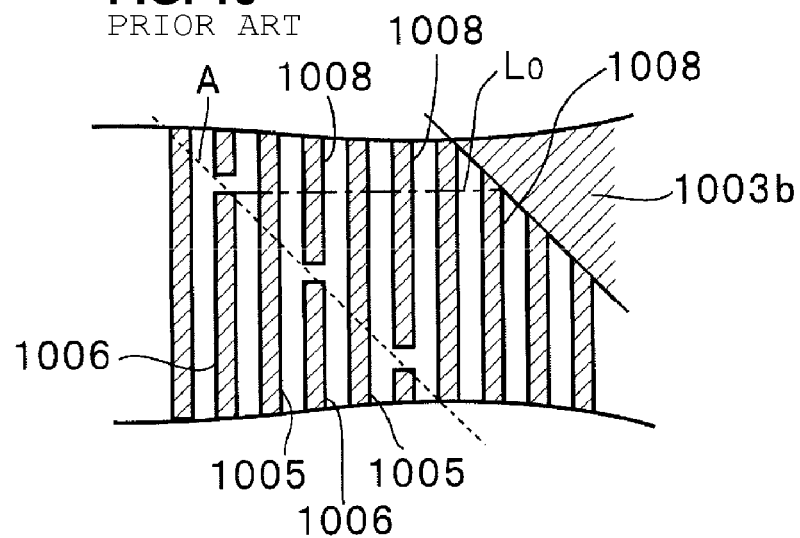
FIG. 15 is a partially notched plan view showing a major portion of the surface acoustic wave resonator shown in FIG. 14.

FIG. 13 is a graph showing filter characteristics of the above-mentioned ladder-type filter. From FIG. 13, it is understood that good filter characteristics are exhibited on the right shoulder of the passband as shown by an arrow D.

It is also understood that sufficient attenuations are obtained in a band higher than the passband as shown by an arrow E.

Modifications

In the surface acoustic wave resonator 1 according to the above-mentioned preferred embodiments, a single cross width-weighted portion is preferably provided in which the cross widths are reduced as they move away from the largest cross width portion and move closer to both ends of the IDT electrode. However, a plurality of such cross width-weighted portions may be provided in the surface acoustic wave propagation direction. In other words, if the cross width-weighted portion of the surface acoustic wave resonator 1 is considered as one cycle, cross width-weighted portions may be provided so that a plurality of cycles are provided.

In addition, in the above-mentioned surface acoustic wave resonator 1, the edge 11a of the first bus bar and the edge 12a of the second bus bar 12 include the inclined portions 11a1 and 11a2 and inclined portions 12a1 and 12a2, respectively, and non-inclined portions are provided between the inclined portions 11a1 and 11a2 and between the inclined portions 12a1 and 12a2. However, the non-inclined portions do not always need to be provided. In other words, the edges 11a and 12a may be configured so that each of the edges includes only two inclined portions extending from the largest cross width portion toward both ends of the IDT electrode in the surface acoustic wave propagation direction.

Also, in the surface acoustic wave resonator 1 according to the above-mentioned preferred embodiment, the SiO$_2$ film 6 is provided to improve frequency-temperature characteristics. However, the frequency-temperature coefficient may be reduced in a similar manner by providing an insulating film other than SiO$_2$. While the SiN film 7 is provided to adjust the frequency, the frequency may be adjusted by providing an insulating film, a metallic film, or other suitable film other than the SiN film 7.

Further, the $SiO_2$ film or SiN film do not always need to be provided.

In addition, in the surface acoustic wave resonator 1 according to the above-mentioned preferred embodiment, the cross widths are weighted so that the cross width located at the center of the IDT electrode in the surface acoustic wave propagation direction is the largest and the cross widths closer to both ends thereof are reduced. However, such a cross width-weighted portion may be provided in a plurality of cycles.

Also, in the above-mentioned preferred embodiments, the cross widths of the reflectors 4 and 5 are preferably weighted so that the lengths of the electrode fingers thereof vary along the surface acoustic wave propagation direction. However, normal reflectors in which the electrode fingers have a constant length may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave resonator comprising:
   a piezoelectric substrate;
   an IDT electrode provided on the piezoelectric substrate; and
   a pair of reflectors arranged adjacent to both ends of the IDT electrode in a surface acoustic wave propagation direction; wherein
   the IDT electrode includes:
     first and second bus bars;
     a plurality of first electrode fingers extending from the first bus bar toward the second bus bar;
     a plurality of second electrode fingers extending from the second bus bar toward the first bus bar;
     first dummy electrodes opposed to tips of the first electrode fingers with gaps therebetween and connected to the second bus bar; and
     second dummy electrodes opposed to tips of the second electrode fingers with gaps therebetween and connected to the first bus bar;
   the IDT electrode is cross-width weighted so that the IDT electrode includes a cross width-weighted portion in which electrode finger cross widths of the IDT electrode are reduced as the cross widths are located farther away from a portion having a largest cross width and are located closer to both ends of the IDT electrode in the surface acoustic wave propagation direction;
   an edge of the first bus bar to which the first electrode fingers and the second dummy electrodes are connected includes an inclined portion that is inclined relative to the surface acoustic wave propagation direction so that the edge of the first bus bar is spaced a predetermined distance away from an envelope obtained by the cross width weighing;
   an edge of the second bus bar to which the second electrode fingers and the first dummy electrodes are connected includes an inclined portion that is inclined relative to the surface acoustic wave propagation direction so that the edge of the second bus bar is spaced a predetermined distance away from the envelope obtained by the cross width weighting;
   a length of an electrode finger of one of the reflectors that is adjacent to an outermost electrode of the IDT electrode is approximately equal to a sum of a length of an outermost electrode finger of the IDT electrode and a length of a dummy electrode opposed to a tip of the outermost electrode finger; and
   wherein a sum of numbers of electrode fingers and dummy electrodes that a straight line extending from a tip of at least one electrode finger of the IDT electrode in the surface acoustic wave propagation direction crosses before reaching one of the edge of the first bus bar and the edge of the second bus bar is represented by N, N is at least 11, and the number of electrode fingers included in one of the pair of reflectors is approximately N.

2. The surface acoustic wave resonator according to claim 1, wherein N is at least 17.

3. The surface acoustic wave resonator according to claim 1, wherein N is 30 or less.

4. A ladder-type filter comprising:
   a plurality of series arm resonators; and
   a plurality of parallel arm resonators; wherein
   at least two resonators of the series arm resonators and the parallel arm resonators are defined by the surface acoustic wave resonators according to claim 1.

5. The ladder-type filter according to claim 4, wherein
   the ladder-type filter includes first and second surface acoustic wave resonators arranged so that surface acoustic wave propagation directions thereof are parallel or substantially parallel to each other define the at least two surface acoustic wave resonators;
   an outer edge of one of the first and second bus bars of one of the first and second surface acoustic wave resonators that is opposed to an edge to which one of the first and second electrode fingers and one of the second and first dummy electrodes are connected, is inclined so that the outer edge of the one of the first and second bus bars is spaced a predetermined distance away from the envelope, and the second bus bar of the second surface acoustic wave resonator is located outside of the outer edge of the first bus bar of the first surface acoustic wave resonator in a direction perpendicular or substantially perpendicular to the surface acoustic wave propagation direction.

* * * * *